US012771362B2

(12) United States Patent
Pan et al.

(10) Patent No.: US 12,771,362 B2
(45) Date of Patent: Oct. 20, 2026

(54) VARIABLE RESISTOR AND DIGITAL-TO-ANALOG CONVERTER

(71) Applicant: United Microelectronics Corp., Hsinchu (TW)

(72) Inventors: Cheng-Hung Pan, Kaohsiung City (TW); Te Pin Lin, Changhua County (TW); Chien Jung Ma, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 461 days.

(21) Appl. No.: 18/501,036

(22) Filed: Nov. 3, 2023

(65) Prior Publication Data

US 2025/0119151 A1 Apr. 10, 2025

(30) Foreign Application Priority Data

Oct. 7, 2023 (CN) .......................... 202311286522.8

(51) Int. Cl.
*H03M 1/66* (2006.01)
*H01C 10/50* (2006.01)
*H03M 1/06* (2006.01)

(52) U.S. Cl.
CPC .......... *H03M 1/0604* (2013.01); *H01C 10/50* (2013.01)

(58) Field of Classification Search
CPC .... H03M 1/0604; H03M 1/785; H03M 1/808; H01C 10/50
See application file for complete search history.

(56) References Cited

U.S. PATENT DOCUMENTS

| | | | | |
|---|---|---|---|---|
| 7,184,314 | B2 * | 2/2007 | Hosono .................. | G11C 16/32 365/185.25 |
| 7,956,782 | B2 | 6/2011 | Werking | |
| 10,951,227 | B1 * | 3/2021 | Thinakaran ........... | H03M 1/785 |
| 2005/0259495 | A1 | 11/2005 | Chung | |
| 2016/0078957 | A1 * | 3/2016 | Kim ..................... | G09G 3/3648 365/185.21 |

* cited by examiner

*Primary Examiner* — Jean B Jeanglaude
(74) *Attorney, Agent, or Firm* — JCIPRNET

(57) ABSTRACT

A variable resistor and a digital-to-analog converter are provided. The variable resistor includes a main resistor, a plurality of switches, and a plurality of redundancy resistors. The switches are respectively constituted by a plurality of non-volatile memory cells. The switches are coupled to the main resistor. The redundancy resistors are respectively coupled to the main resistor through the switches.

14 Claims, 5 Drawing Sheets

VARIABLE RESISTOR AND DIGITAL-TO-ANALOG CONVERTER

CROSS-REFERENCE TO RELATED APPLICATION

This application claims the priority benefit of China application serial no. 202311286522.8, filed on Oct. 7, 2023. The entirety of the above-mentioned patent application is hereby incorporated by reference herein and made a part of this specification.

BACKGROUND

Technical Field

The disclosure relates to a variable resistor and a digital-to-analog converter, and in particular, to a variable resistor and a digital-to-analog converter that may be used for output voltage correction.

Description of Related Art

In a digital-to-analog converter, it is often necessary to dispose a certain number of resistors as the basis for digital-to-analog conversion. However, in integrated circuits, if there are differences in the resistors in the digital-to-analog converter, it will affect the matching between the internal resistors and cause the output voltage to be incorrect, especially in digital-to-analog converters in audio products. The digital-to-analog converters in the audio products often require the application of long strings of polycrystalline silicon resistors. Once the resistance values of the polycrystalline silicon resistors change, the product may not operate normally.

SUMMARY

The disclosure provides a variable resistor and a digital-to-analog converter. By adjusting the resistance value of the variable resistor, the mismatch in the output voltage of the digital-to-analog converter may be corrected.

A variable resistor of the disclosure includes a main resistor, a plurality of switches, and a plurality of redundancy resistors. The plurality of switches are respectively constituted by a plurality of non-volatile memory cells. The switches are coupled to the main resistor. The redundancy resistors are respectively coupled to the main resistor through the switches.

A digital-to-analog converter of the disclosure includes a plurality of circuit slices. Each circuit slice includes a tri-level switch, a first resistor, a second resistor, a first transistor, and a second transistor. The first transistor and the first resistor are connected in series to each other between a power end of the tri-level switch and an operating power end of the digital-to-analog converter. The second transistor and the second resistor are connected in series to each other between a reference end of the tri-level switch and a ground end of the digital-to-analog converter. The first resistor and the second resistor are variable resistors as described above.

Based on the above, the variable circuit of the disclosure uses the plurality of non-volatile memory cells to respectively construct the plurality of switches, and by turning on or off each switch, the connection relationship between the main resistor and the plurality of redundancy resistors is adjusted such that the resistance value of the variable resistor may be adjusted. The variable resistor of the disclosure may be disposed in a digital-to-analog converter and configured to correct the output voltage so as to reduce the mismatch in the output voltage.

DESCRIPTION OF THE EMBODIMENTS

Figure 1:
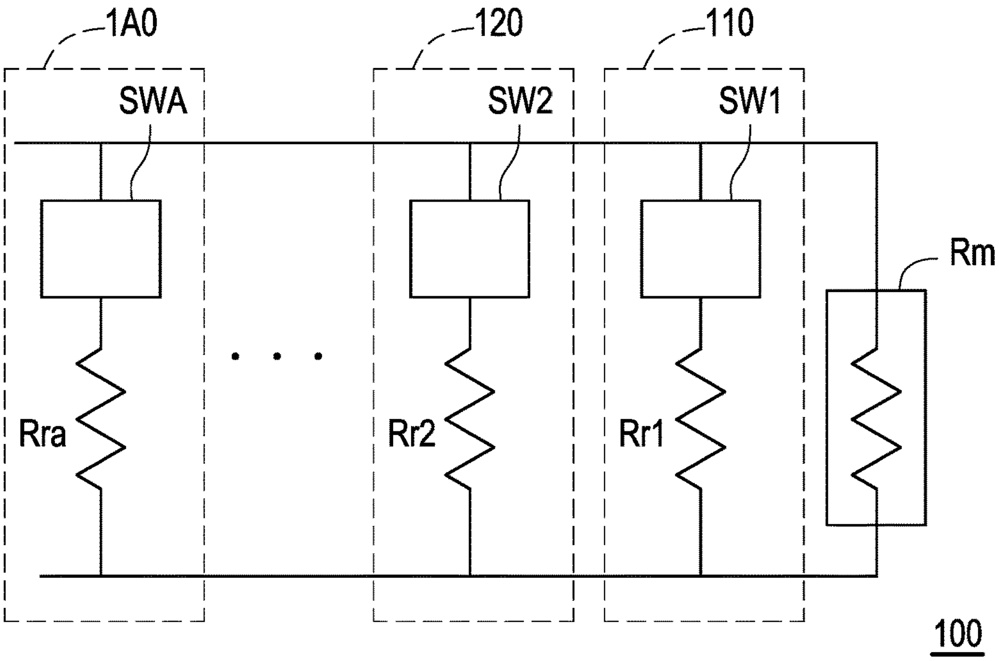
FIG. 1 is a schematic circuit diagram of a variable resistor according to an embodiment of the disclosure.

Please refer to FIG. 1. FIG. 1 is a schematic circuit diagram of a variable resistor according to an embodiment of the disclosure. A variable resistor 100 includes a main resistor Rm, a plurality of switches SW1 to SWA, and a plurality of redundancy resistors Rr1 to Rra. In the embodiment, the switches SW1 to SWA may be constituted by a plurality of non-volatile memory cells. The switch SW1 may be coupled between the redundancy resistor Rr1 and the main resistor Rm, the switch SW2 may be coupled between the redundancy resistor Rr2 and the main resistor Rm, . . . , and the switch SWA may be coupled between the redundancy resistor Rra and the main resistor Rm.

In the embodiment, the non-volatile memory cells used to construct the switches SW1 to SWA may be resistive random access memory cells (ReRAM cells), magnetoresistive random access memory cells (MRAM cells), phase change random access memory cells (PCRAM cells), or ferroelectric random access memory cells (FeRAM cells). The non-volatile memory cells may adjust the provided equivalent resistance value to a high resistance status (HRS) or a low resistance status (LRS) through programmed actions. Taking the switch SW1 as an example, when the non-volatile memory cell serving as the switch SW1 is programmed into a high resistance status, the switch SW1 may be considered to be in the cut-off status. In contrast, when the non-volatile memory cell serving as the switch SW1 is programmed into a low resistance status, the switch SW1 may be considered to be in the turned-on status.

In the embodiment, the switch SW1 and the redundancy resistor Rr1 are connected in series to each other and form a first resistor set 110. The switch SW2 and the redundancy resistor Rr2 are connected in series to each other and form a second resistor set 120, . . . , and the switch SWA and the redundancy resistor Rra are connected in series to each other and form the A-th resistor set 1A0. The first resistor set 110 to the A-th resistor set 1A0 and the main resistor Rm are connected in parallel to each other.

When the resistance value of the variable resistor 100 is to be adjusted, a programmed operation may be performed on at least one of the non-volatile memory cells serving as the switches SW1 to SWA. By adjusting the turned-on or cut-off status of at least one of the switches SW1 to SWA, the resistance value of the variable resistor 100 is changed. For example, in the embodiment, when the variable resistor 100 is required to provide a relatively large resistance value, the non-volatile memory cells serving as the switches SW1 to SWA may be programmed to have a high resistance status, so that the switches SW1 to SWA are cut off. At this time, the resistance value of the variable resistor 100 is substantially equal to the resistance value of the main resistor Rm.

When the resistance value of the variable resistor 100 is to be decreased, one of the non-volatile memory cells serving as the switches SW1 to SWA may be programmed into a low resistance status and turned on (the remaining switches remain the cut off status). Taking the switch SW1 being turned on as an example, at this time, the resistance value of the variable resistor 100 is substantially equal to the resistance values of the main resistor Rm and the redundancy resistor Rr1 connected in parallel to each other.

Continuing with the above embodiment, when the resistance value of the variable resistor 100 is to be further decreased, the non-volatile memory cell serving as the switch SW2 may also be programmed into a low resistance status, and the switch SW2 may also be turned on. When, the resistance value of the variable resistor 100 is substantially equal to the resistance values of the main resistor Rm, the redundancy resistor Rr1, and the redundancy resistor Rr2 connected in parallel to each other. In the embodiment, when all switches SW1 to SWA are turned on, the variable resistor 100 may have the lowest resistance value.

Please note here that in the embodiment, the high and low resistance statuses of the non-volatile memory cells serving as the switches SW1 to SWA may be changed multiple times. In other words, the turned-on or cut-off status of each of the switches SW1 to SWA may be adjusted at any time according to actual requirements.

It is worth mentioning that in the embodiment, the resistance values of the redundancy resistors Rr1 to Rra may be the same or different from each other, without certain limitations. The resistance values of the redundancy resistors Rr1 to Rra may be the same or different from the resistance value of the main resistor Rm, and there is no fixed limitation.

In addition, in the embodiment of the disclosure, the number of the redundancy resistors and the corresponding switches may also be two or more, and there is no specific limit. A person with ordinary knowledge in the art may set any number of the redundancy resistors and the corresponding switches according to the range of the resistance value of the variable resistor 100 to be adjusted, and there is no fixed limitation.

The variable resistor 100 of the disclosure may be used in various types of circuits, such as digital-to-analog converters. By changing the turned-on or cut-off status of each of the switches SW1 to SWA, the resistance value of the variable resistor 100 may be adjusted, and the output voltage of the digital-to-analog converter may be adjusted to correct the mismatch in the output voltage.

Figure 2:
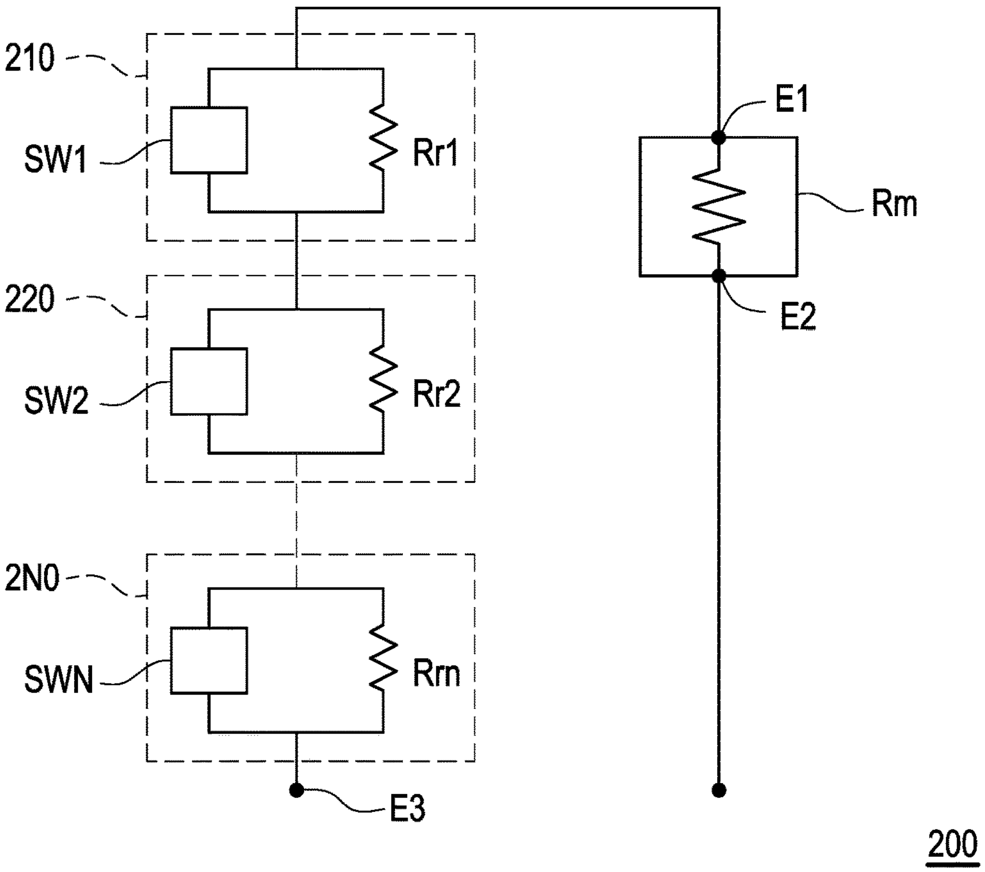
FIG. 2 is a schematic circuit diagram of a variable resistor according to another embodiment of the disclosure.

Please refer to FIG. 2 below. FIG. 2 is a schematic circuit diagram of a variable resistor according to another embodiment of the disclosure. A variable resistor 200 includes the main resistor Rm, a plurality of switches SW1 to SWN, and a plurality of redundancy resistors Rr1 to Rrn. The switches SW1 to SWN and the redundancy resistors Rr1 to Rmn respectively form a plurality of resistor sets 210 to 2N0.

In the embodiment, the resistor sets 210 to 2N0 are coupled in series to the main resistor Rm. A first end E1 of the main resistor Rm is coupled to the resistor set 210. The resistance value provided by the variable resistor 200 between the ends E2 and E3 may be adjusted through the turned-on or cut-off action of each of the switches SW1 to SWN.

Similarly, the turned-on or cut-off status of each of the switches SW1 to SWN may be adjusted by programming the non-volatile memory cells serving as each of the switches SW1 to SWN into a high resistance status or a low resistance status. When the non-volatile memory cell is programmed into a high resistance status, the corresponding switch is in the cut-off status; conversely, when the non-volatile memory cell is programmed into a low resistance status, the corresponding switch is in the turned-on status.

In the embodiment, the switches SW1 to SWN are used to respectively bypass the corresponding redundancy resistors Rr1 to Rrn. When any one of the switches SW1 to SWN is turned on, the redundancy resistor (one of the redundancy resistors Rr1 to Rrn) will be bypassed. Based on the above, when all of the corresponding switches SW1 to SWN are in the turned-on status, the resistance value of the variable resistor 200 is equal to the resistance value of the main resistor Rm. When the resistance value of the variable resistor 200 is to be increased, at least one of the switches SW1 to SWN may be cut off. For example, when the switch SW1 is cut off and the remaining switches SW2 to SWN are turned on, the resistance value of the variable resistor 200 is equal to the sum of the resistance values of the main resistor Rm and the redundancy resistor Rr1. When all of the switches SW1 to SWN are cut off, the variable resistor 200 may have a maximum resistance value, which is equal to the sum of the resistance values of the main resistor Rm and all of the redundancy resistors Rr1 to Rrn.

Similar to the embodiment of FIG. 1, the resistance values of the redundancy resistors Rr1 to Rrn of the embodiment may be the same or different from each other, without certain limitations. The resistance values of the redundancy resistors Rr1 to Rrn may be the same or different from the resistance value of the main resistor Rm, and there is also no fixed limitation. The number of the redundancy resistors Rr1 to Rrn and the number of the switches SW1 to SWN may be set according to the range of the resistance value of the variable resistor 200 to be adjusted, and there is also no fixed limitation.

Figure 3:
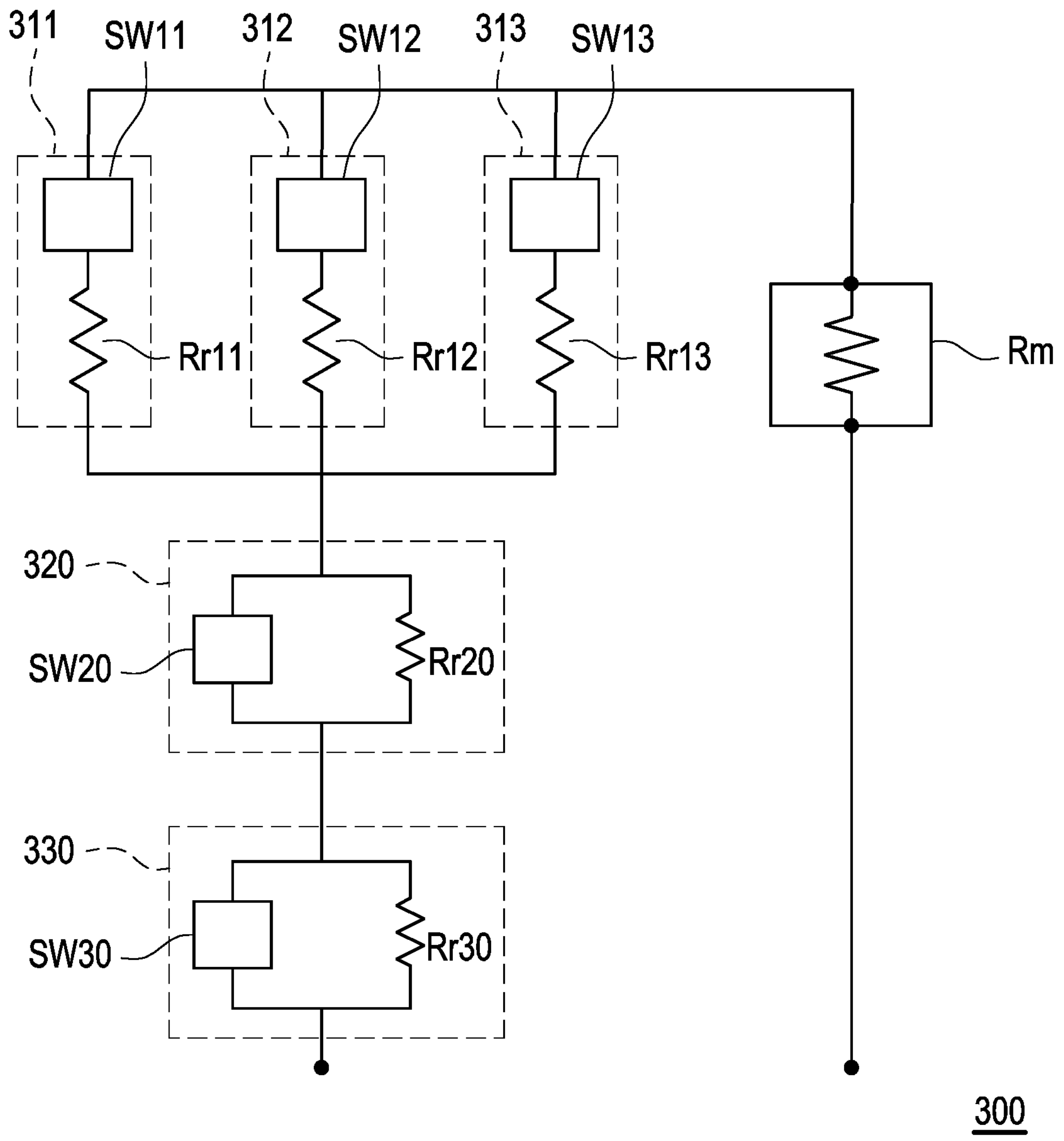
FIG. 3 is a schematic circuit diagram of a variable resistor according to another embodiment of the disclosure.

Please refer to FIG. 3 below. FIG. 3 is a schematic circuit diagram of a variable resistor according to another embodiment of the disclosure. In the embodiment of FIG. 1, the plurality of resistor sets 110 to 1A0 may be configured to be in parallel to each other. In the embodiment of FIG. 2, the plurality of resistor sets 210 to 2N0 may be configured to be in series to each other. The embodiment may be combined with the concepts of the embodiments of FIG. 1 and FIG. 2, in which a variable resistor 300 includes a plurality of resistor sets 311 to 313, 320, and 330. The resistor sets 320 and 330 are connected in series to each other. The resistor sets 311 to 313 are connected in parallel to each other and in series between the resistor string formed by the resistor sets 320 and 330 and the main resistor Rm.

In the embodiment, the resistor sets 311 to 313 respectively include switches SW11 to SW13 and redundancy resistors Rr11 to Rr13. The switches SW11 to SW13 are coupled in series to each other, respectively, with the redundancy resistors Rr11 to Rr13. The resistor sets 311 to 313 may be coupled in parallel to each other as shown in the embodiment of FIG. 1. The resistor sets 320 and 330 respectively have switches SW20 and SW30 and redundancy resistors Rr20 and Rr30. The switches SW20 and SW30 may be coupled in parallel to each other, respectively, with the redundancy resistors Rr20 and Rr30. The resistor sets 320 and 330 may be coupled in series to each other as shown in the embodiment of FIG. 2.

Similar to the previous embodiment, by controlling the turned-on or cut-off status of each of the switches SW11 to SW13, SW20, and SW30, the resistance value of the variable resistor 300 may be adjusted. It is worth mentioning that in other embodiments of the disclosure, the statuses of the plurality of resistor sets in series and in parallel may be adjusted according to the requirements of the designer. The illustrations in FIG. 1 to FIG. 3 are only examples for illustration and are not intended to limit the scope of the disclosure.

Figure 4:
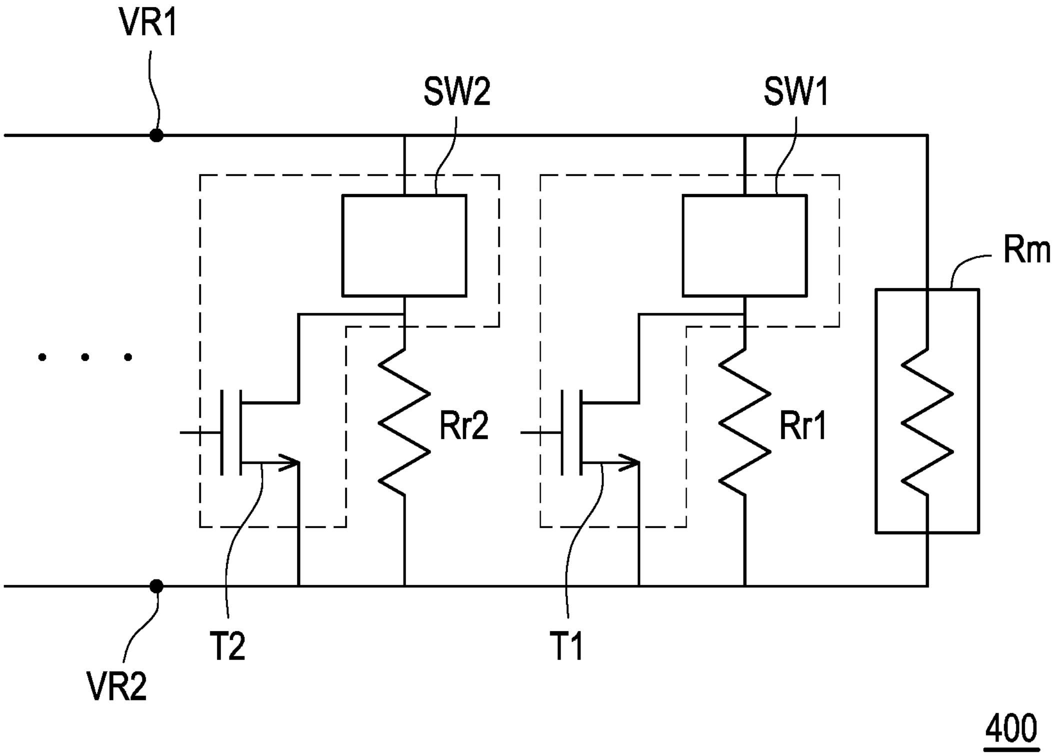
FIG. 4 is a schematic circuit diagram of a variable resistor according to another embodiment of the disclosure.

Please refer to FIG. 4. FIG. 4 is a schematic circuit diagram of a variable resistor according to another embodiment of the disclosure. A variable resistor 400 includes the main resistor Rm, switches SW1 and SW2, and the redundancy resistors Rr1 to Rr2. The switches SW1 and SW2 respectively correspond to the redundancy resistors Rr1 to Rr2. The switches SW1 and SW2 are coupled in series to each other, respectively, with the redundancy resistors Rr1 to Rr2. In the embodiment, the switches SW1 and SW2 are non-volatile memory cells and are respectively coupled to transistors T1 and T2. One end of the switch SW1 may be coupled to a voltage rail VR1. Another end of the switch SW1 may be coupled to a first end of the transistor T1. A second end of the transistor T1 may be coupled to another voltage rail VR2. Similarly, one end of the switch SW2 may be coupled to the voltage rail VR1. Another end of the switch SW2 may be coupled to a first end of the transistor T2. A second end of the transistor T2 may be coupled to another voltage rail VR2.

When a programmed action is to be performed on the non-volatile memory cell serving as the switch SW1, a bias voltage may be applied through a control end of the transistor T1 to turn on the transistor T1. Then, a moderate voltage difference may be provided between two ends of the non-volatile memory cell serving as the switch SW1 through the voltage rail VR1 and the voltage rail VR2, and the non-volatile memory cell serving as the switch SW1 may be programmed into a high resistance status or a low resistance status. When a programmed action is to be performed on the non-volatile memory cell serving as the switch SW2, the transistor T2 may be turned on, and by applying a moderate bias voltage to the voltage rail VR1 and the voltage rail VR2, the programmed action of the non-volatile memory cell serving as the switch SW2 may be completed.

Figure 5:
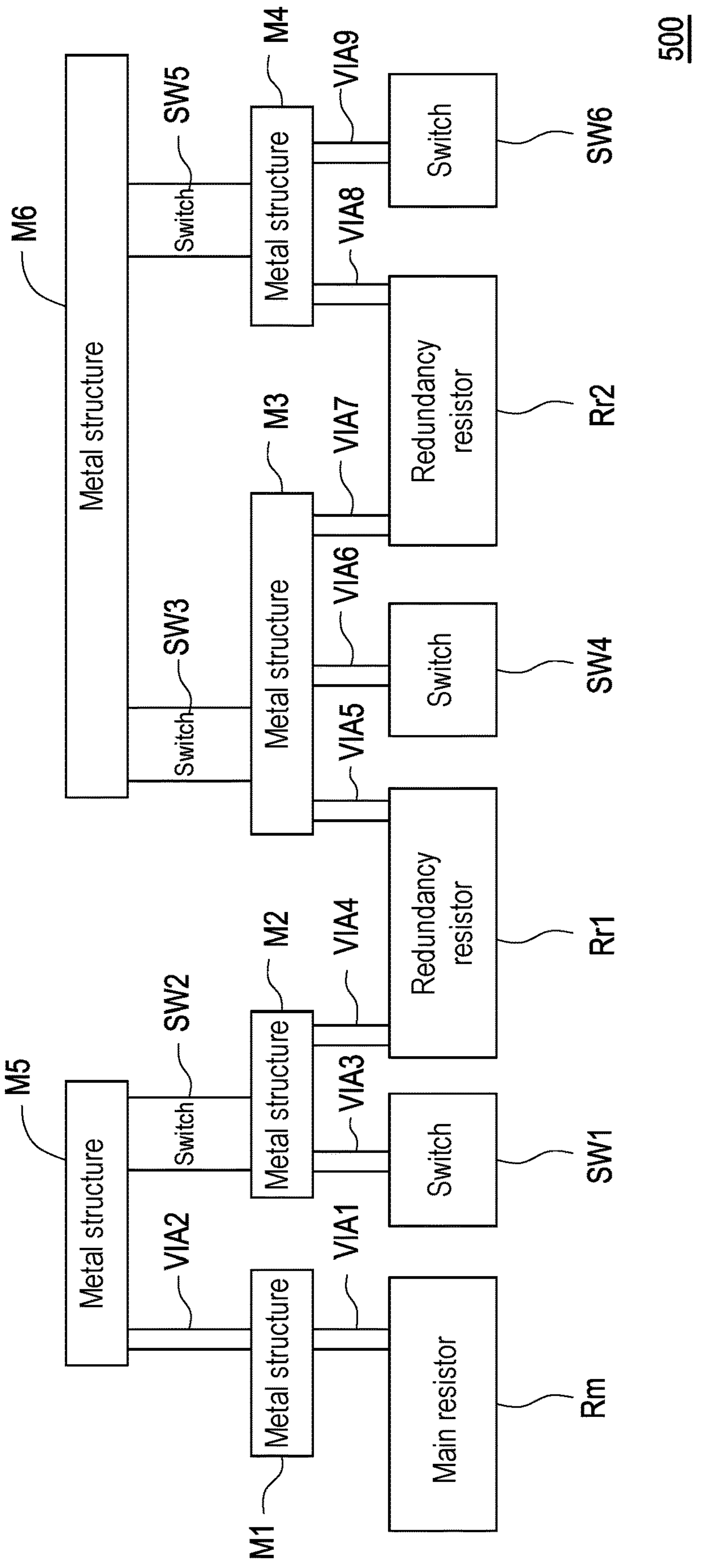
FIG. 5 is a schematic structural diagram of a variable resistor according to an embodiment of the disclosure.

Please refer to FIG. 5. FIG. 5 is a schematic structural diagram of a variable resistor according to an embodiment of the disclosure. A variable resistor 500 includes the main resistor Rm, switches SW1 to SW6, and the redundancy resistors Rr1 and Rr2. Each of the switches SW1 to SW6 may be constituted by using the non-volatile memory cells, and is equivalent to a cut-off status when programmed into a high resistance status, and equivalent to a turned-on status when programmed into a low resistance status.

In terms of the connection relationship, the main resistor Rm may be coupled to a metal structure M1 through a conductive via hole VIA1. The metal structure M1 may be coupled to one end of a metal structure M5 through a conductive via hole VIA2. In addition, another end of the metal structure M5 may be coupled to one end of the switch SW2, and another end of the switch SW2 may be coupled to an upper surface of a metal structure M2. One end of a lower surface of the metal structure M2 may be coupled to the redundancy resistor Rr1 through the conductive via hole VIA4, and another end of the lower surface of the metal structure M2 may be coupled to the switch SW1 through a conductive via hole VIA3.

In addition, the redundancy resistor Rr1 may be coupled to a lower surface of the metal structure M3 through a conductive via hole VIA5. The lower surface of the metal structure M3 may also be respectively coupled to the switch SW4 and the redundancy resistor Rr2 through conductive via holes VIA6 and VIA7. An upper surface of the metal structure M3 may be coupled to the switch SW3 and coupled to a metal structure M6 through the switch SW3.

The redundancy resistor Rr2 may be coupled to a lower surface of the metal structure M4 through a conductive via hole VIA8. The lower surface of the metal structure M4 may also be coupled to the switch SW6 through a conductive via hole VIA9. An upper surface of the metal structure M4 may be coupled to the switch SW5 and coupled to the metal structure M6 through the switch SW5.

It is worth mentioning that the switches SW1, SW4, and SW6 coupled in parallel with the redundancy resistors Rr1 and Rr2 respectively may be used to bypass the redundancy resistors Rr1 and Rr2.

Regarding the adjustment details of the resistance value of the variable resistor 500, when the switch SW2 is in a cut-off status, the resistance value of the variable resistor 500 may be equal to the resistance value of the main resistor Rm. On the other hand, when the switch SW2 is turned on, the main resistor Rm may be coupled to the redundancy resistors Rr1 and Rr2 of the subsequent stage. At this time, if the switches SW1, SW4, and SW6 are in the cut-off status, and at least one of the switches SW3 and SW5 is in the cut-off status, the resistance value of the variable resistor 500 may be equal to the sum of the resistance values of the main resistor Rm and the redundancy resistors Rr1 and Rr2.

In addition, by turning on the switches SW3 and SW5 at the same time, the redundancy resistor Rr2 may be bypassed and the resistance value of the variable resistor 500 may be reduced. By turning on at least one of the switches SW1, SW4, and SW6, at least one of the corresponding redundancy resistors Rr1 and Rr2 may also be bypassed, and the resistance value of the variable resistor 500 may be reduced.

It is worth mentioning that in the embodiment, the metal structures M1 to M4 may be disposed on the same first metal layer in the integrated circuit, and the metal structures M5 and M6 may be disposed on the same second metal layer in the integrated circuit. A height of the second metal layer may be higher than a height of the first metal layer.

Please note that the configuration of the embodiment in FIG. 5 is only an example for illustration and is not intended to limit the scope of the disclosure. In the embodiment of the disclosure, the configuration relationship between the plurality of switches and the plurality of redundancy resistors may be adjusted and disposed by the designer according to actual requirements, and there is no fixed form. The main resistor, the switches, and the redundancy resistors may be connected in any form through the metal layer and conductive via holes in the integrated circuit, so that each of the switches and the corresponding redundancy resistor are connected in parallel or in series to each other, and the plurality of resistor sets formed by the plurality of switches and the plurality of respectively corresponding redundancy resistors are connected in parallel or in series to each other.

Figure 6:
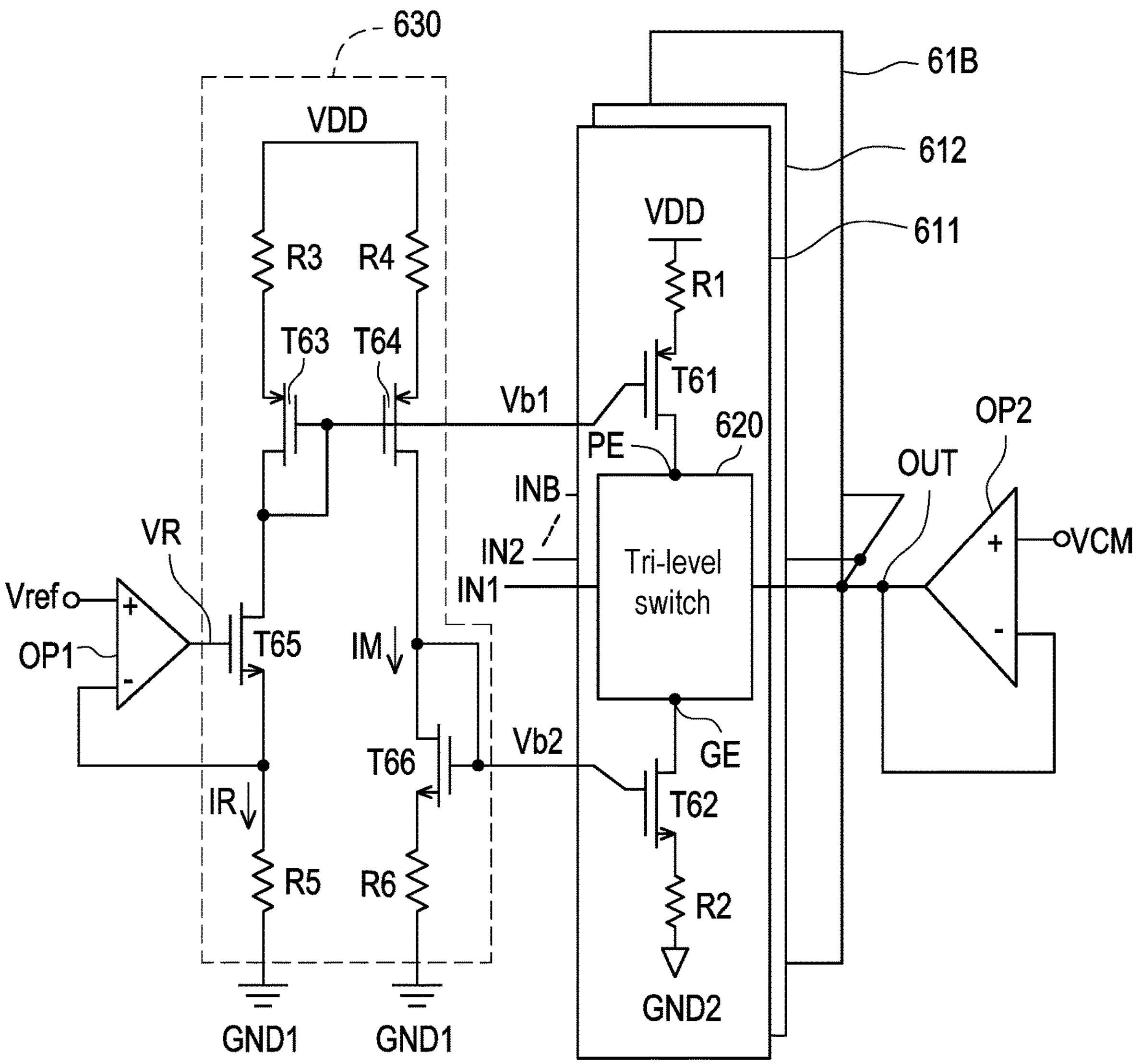
FIG. 6 is a schematic diagram of a digital-to-analog converter according to an embodiment of the disclosure.

Please refer to FIG. 6. FIG. 6 is a schematic diagram of a digital-to-analog converter according to an embodiment of the disclosure. A digital-to-analog converter 600 includes a plurality of circuit slices 611 to 61B and a bias voltage generator 630. Output ends of the circuit slices 611 to 61B are jointly coupled to an output end OUT of the digital-to-analog converter 600. The circuit slices 611 to 61B respectively receive a plurality of digital input signals IN1 to INB.

Each of the circuit slices 611 to 61B may have a similar circuit structure. Taking the circuit slice 611 as an example, the circuit slice 611 includes a tri-level switch 620, resistors R1, R2, and transistors T61 and T62. The transistor T61 and the resistor R1 are connected in series to each other between a power end PE of the tri-level switch 620 and an operating power end VDD of the digital-to-analog converter 600. The transistor T62 and the resistor R2 are connected in series between a reference end GE of the tri-level switch 620 and a ground end GND2 of the digital-to-analog converter 600. The tri-level switch 620 receives the input signal IN1, and may output the output signal of three voltage levels according to the input signal IN1 to the output end OUT of the digital-to-analog converter 600.

Control ends of transistors T61 and T62 respectively receive bias voltages Vb1 and Vb2. The bias voltages Vb1 and Vb2 may be provided by the bias voltage generator 630.

It is worth noting that in the embodiment, the resistors R1 and R2 may be implemented by using any of the variable resistors 100 to 500 of FIG. 1 to FIG. 5. By adjusting the resistance values of the resistors R1 and R2, the mismatch in the output voltage generated by the digital-to-analog converter 600 may be effectively corrected.

The output end OUT of the digital-to-analog converter 600 of the embodiment is further coupled to an output end of an operational amplifier OP2. A negative input end of the operational amplifier OP2 is coupled to the output end thereof to form a voltage follower. A positive input end of the operational amplifier OP2 may receive a preset common voltage VCM, and the operational amplifier OP2 may provide an output voltage equal to the common voltage VCM to the output end OUT of the digital-to-analog converter 600.

The bias voltage generator 630 includes resistors R3 to R6 and transistors T63 to T66. First ends of the resistors R3 and R4 are coupled to the operating power end VDD to receive the operating power. A first end of the transistor T63 is coupled to a second end of the resistor R3, and a control end of the transistor T63 is coupled to a second end thereof to form a diode connection configuration. A first end of the transistor T64 is coupled to the second end of the resistor R4, and a control end of the transistor T64 is coupled to the control end of the transistor T63. The transistor T65 and the resistor R5 are connected in series to each other between the second end of the transistor T63 and a ground end GND1. A control end of the transistor T65 receives a reference voltage VR. The transistor T66 and the resistor R6 are connected in series to each other between the second end of the transistor T64 and the ground end GND1. A control end of the transistor T66 is coupled to a first end thereof and forms a diode connection configuration.

In the embodiment, the reference voltage VR may be provided by an operational amplifier OP1. A positive input end of the operational amplifier OP1 receives a reference voltage Vref, and a negative input end of the operational amplifier OP1 is coupled to a second end of the transistor T65. An output end of the operational amplifier OP1 may dynamically adjust the output reference voltage VR, so that the second end of the transistor T65 may maintain equal to the reference voltage Vref. The reference voltage Vref may have a preset voltage value.

By limiting the second end of the transistor T65 to be equal to the reference voltage Vref, the resistor R5 may provide a reference current IR. The transistors T65 and T64 may form a current mirror, and generate a mirror current IM through the transistor T66 according to the reference current IR on the mirror resistor R5. In this way, the transistor T63 in the diode connection configuration may receive the reference current IR and thereby generate the bias voltage Vb1. The transistor T65, which is also in the diode connection configuration, may receive the mirror current IM and thereby generate the bias voltage Vb2.

It is worth noting that in the embodiment, the resistors R3, R5, and R6 may be implemented using any one of the variable resistors 100 to 500 of FIG. 1 to FIG. 5. By adjusting the resistance value of at least one of the resistors R3, R5, and R6, the bias voltage generator 630 may provide the correct bias voltages Vb1 and Vb2.

To sum up, the variable resistor of the disclosure is made of the plurality of switches constituted by the non-volatile memory cells and the plurality of redundancy resistors connected to each other. Through the programmed actions on the non-volatile memory cells, the switches are turned on or cut off, and the connection relationship between the main resistor and the redundancy resistors is adjusted to adjust the resistance value of the variable resistor. The variable resistor of the disclosure may be applied in a digital-to-analog converter. By adjusting the resistance value of one or more resistors in the digital-to-analog converter, the mismatch in the output voltage may be corrected and the stability of the system performance may be maintained.

What is claimed is:

1. A variable resistor, comprising:

a main resistor;

a plurality of switches, respectively constituted by a plurality of non-volatile memory cells, and coupled to the main resistor; and a plurality of redundancy resistors, respectively coupled to the main resistor through the plurality of switches.

2. The variable resistor according to claim 1, wherein each of the redundancy resistors and the main resistor are connected in series or in parallel to each other.

3. The variable resistor according to claim 1, wherein each of the non-volatile memory cells is programmed into a high resistance status to cut off a connection relationship between the main resistor and each of the corresponding redundancy resistors.

4. The variable resistor according to claim 1, wherein each of the non-volatile memory cells is programmed into a low resistance status to turn on a connection relationship between the main resistor and each of the corresponding redundancy resistors.

5. The variable resistor according to claim 1, wherein any two of the plurality of redundancy resistors are connected in series or in parallel to each other.

6. The variable resistor according to claim 1, wherein a first end of each of the switches is coupled to a first metal structure, a second end of each of the switches is coupled to a second metal structure, the first metal structure is coupled to the main resistor, and the second metal structure is coupled to each of the corresponding redundancy resistors.

7. The variable resistor according to claim 1, wherein each of the non-volatile memory cells is a resistive random access memory cell, a magnetoresistive random access memory cell, a phase change random access memory cell, or a ferroelectric random access memory cell.

8. The variable resistor according to claim 1, wherein the variable resistor is disposed in a digital-to-analog converter.

9. The variable resistor according to claim 1, wherein each of the switches and each of the corresponding redundancy resistors are connected in parallel or in series to each other.

10. The variable resistor according to claim 1, wherein the plurality of switches and the plurality of redundancy resistors respectively form a plurality of resistor sets, and the plurality of resistor sets are connected in series or in parallel to each other.

11. A digital-to-analog converter, comprising:

a plurality of circuit slices, wherein each of the circuit slices comprises:

a tri-level switch;

a first resistor and a second resistor; and a first transistor and a second transistor, wherein the first transistor and the first resistor are connected in series to each other between a power end of the tri-level switch and an operating power end of the digital-to-analog converter, and the second transistor and the second resistor are connected in series to each other between a reference end of the tri-level switch and a first ground end, wherein the first resistor and the second resistor are variable resistors as in claim 1.

12. The digital-to-analog converter according to claim 11, further comprising:

a bias voltage generator, respectively providing a first bias voltage and a second bias voltage to a control end of the first transistor and a control end of the second transistor.

13. The digital-to-analog converter according to claim 12, wherein the bias voltage generator comprises:

a third resistor, having a first end for receiving an operating power;

a fourth resistor, having a first end for receiving the operating power;

a third transistor, having a first end coupled to a second end of the third resistor, wherein a control end of the third transistor is coupled to a second end of the third transistor;

a fourth transistor, having a first end coupled to a second end of the fourth resistor, wherein a control end of the fourth transistor coupled to the control end of the third transistor;

a fifth transistor and a fifth resistor, connected in series to each other between the second end of the third transistor and a second ground end, wherein a control end of the fifth transistor receives a reference voltage; and a sixth transistor and a sixth resistor, connected in series to each other between a second end of the fourth transistor and the second ground end, wherein a control end of the sixth transistor is coupled to a first end of the sixth transistor.

14. The digital-to-analog converter according to claim 13, wherein each of the third resistor, the fifth resistor, and the sixth resistor is the variable resistor.

* * * * *